United States Patent [19]
Ammo

[11] Patent Number: 6,117,744
[45] Date of Patent: Sep. 12, 2000

[54] METHOD OF FABRICATING SEMICONDUCTOR DEVICE

[75] Inventor: Hiroaki Ammo, Kanagawa, Japan

[73] Assignee: Sony Corporation, Tokyo, Japan

[21] Appl. No.: 09/037,826

[22] Filed: Mar. 11, 1998

[30] Foreign Application Priority Data

Mar. 17, 1997 [JP] Japan ..................................... 9-063181

[51] Int. Cl.$^7$ ................................................. H01L 21/331
[52] U.S. Cl. .......................... 438/309; 438/366; 438/481
[58] Field of Search .................................... 438/309, 364, 438/365, 366, 360, 368, 481

[56] References Cited

U.S. PATENT DOCUMENTS 5,024,957 6/1991 Harame et al. .......................... 438/366
5,773,350 6/1998 Herbert et al. .......................... 438/364

FOREIGN PATENT DOCUMENTS 5-74789 3/1993 Japan .

*Primary Examiner*—Tuan H. Nguyen
*Attorney, Agent, or Firm*—Ronald P. Kananen; Rader, Fishman & Grauer

[57] ABSTRACT

Disclosed is a method of fabricating a semiconductor device for preventing occurrence of an inconvenience due to exposure of a high melting point metal based material, for example, contamination of a chamber atmosphere due to the metal material upon formation of a semiconductor layer in an opening portion by selective epitaxial growth or upon pre-treatment thereof, to reduce occurrence of crystal defects or the like, thereby forming semiconductor devices at a high yield. The method includes the steps of: forming a conductive layer including a high melting point metal based material on a substrate; forming an opening portion in the conductive layer; covering the high melting point metal based material with a film; and forming a semiconductor layer on a portion of the substrate exposed in the opening portion by epitaxial growth after the step of covering the high melting point metal based material with the film.

16 Claims, 4 Drawing Sheets

METHOD OF FABRICATING SEMICONDUCTOR DEVICE

BACKGROUND OF THE INVENTION

The present invention relates to a method of fabricating a semiconductor device. In particular, the present invention relates to a method of fabricating a semiconductor device including the steps of forming a conductive layer made from a high melting point metal based material (for example, a high melting point metal or a silicide thereof) on a semiconductor substrate; forming an opening portion; and forming a semiconductor layer in the opening portion at which a side surface of the conductive layer made from the high melting point metal or the silicide thereof is exposed. The present invention is applicable to a method of fabricating a semiconductor device containing, for example, a bipolar transistor, and particularly to a technique of forming a semiconductor layer, for example, taken as a base layer by selective epitaxial growth.

In recent years, there have been demands toward larger scale integration and higher performance of semiconductor devices typically LSIs. For example, there have been strong demands, particularly, toward higher-speed bipolar transistors.

In general, very high-speed bipolar transistors adopt a double silicon structure in which each of an emitter and a base extension electrode is made from poly-silicon. In this structure, an emitter electrode is isolated from a base electrode by a side wall insulating film, to thereby significantly reduce a base-collector capacitance.

In order to develop a higher-speed bipolar transistor, it is essential to form a heavily doped and thinned base layer. According to related art methods, however, it has been not necessarily easy to obtain a desirable base layer. For example, according to related art ion implantation techniques, it has been difficult to develop a base width of 40 nm or less because of channelling of an implanted impurity.

To solve the problem above, there has been known a method of forming a base layer forming film by epitaxial growth with no channeling. A heavily doped and thinned base layer having a base width of typically 30 nm or less has been formed by doping an impurity in the layer during epitaxial growth. Such a technique has realized a high-speed bipolar transistor having a maximum cutoff frequency of $fT_{max}$=50 GHz and a maximum oscillation frequency $f_{max}$= 30 GHz or more.

Further, the dose of an impurity doped in a base layer can be increased by use of a base layer made from SiGe having a band gap smaller than that of Si. This reduces a base resistance, allowing realization of a high-speed bipolar transistor having a $f_{max}$= about 50 GHz.

An internal base resistance is reduced by the above-described technique using a base layer made from SiGe by epitaxial growth; however, to develop a very high-speed bipolar transistor, it is necessary to reduce an external base resistance. To reduce a resistance of a base electrode, an attempt has been made to replace a poly-silicon structure of a base electrode with a silicide structure using, for example, a high melting point metal or a polycide structure which is a stacked structure of poly-silicon and a silicide. As a silicide material, there has been often used WSi which has been known as a gate electrode material for a MOS transistor, or the like. The use of WSi as the silicide material is effective to develop a BiCMOS in which a base electrode and a gate electrode are formed at the same step.

A related art method of using a base electrode of a polycide structure has been proposed, for example, in Japanese Patent Laid-open No. Hei 5-74789. This document discloses a process of fabricating an NPN transistor having a double poly-silicon structure using a stacked structure of poly-silicon and a silicide of a high melting point metal.

The technique disclosed in the above document, however, has a problem that there may occur contamination due to the silicide of the high melting point metal used for the fabrication process. To be more specific, upon formation of a layer in an opening portion by epitaxial growth, the interior of a chamber may be contaminated by the silicide of the high melting point metal exposed at the opening portion, leading to a possibility of occurrence of crystal defects in the epitaxial growth layer.

The problem above will be described in detail with reference to FIGS. 6 to 8. FIGS. 6 to 8 are sectional views of structures of a semiconductor device sequentially formed by steps of a related art method of fabricating a semiconductor device.

As shown in FIG. 6, an oxide insulating film 2 ($SiO_2$ in this example) having a thickness of, for example, 30 nm is formed over the entire surface of a semiconductor substrate 1 (silicon substrate in this example) by thermal oxidation. A semiconductor layer 3 (poly-silicon film in this example) having a thickness of 100 nm is formed by CVD performed at about 650° C. using for example a $SiH_4$ based gas, and further, a silicide film 4 (WSi film in this example) having a thickness of 80 nm is formed over the entire surface by CVD performed at about 700° C. using for example a $WF_6/H_2$ based gas. Then, ions of, for example, $BF_2$ are implanted at 30 keV in a dose of $5\times10^{-15}$ cm$^{-2}$, to form a P-type polycide.

Next, an insulating film 5 (silicon nitride film, particularly, $Si_3N_4$ film in this example) having a thickness of 150 to 200 nm is formed over the entire surface by for example CVD. Then, these films are patterned using a photoresist having an opening portion at a position of an emitter forming portion. To be more specific, the insulating film 5 ($Si_3N_4$ film) in the opening portion is removed by RIE (Reactive Ion Etching) using for example a $O_2/CHF_3$ based gas, and the silicide/semiconductor layer (WSi/poly-silicon) in the opening portion is removed by RIE using for example a $SF_6/C_2Cl_2F_3$ gas.

Then, the oxide insulating film 2 ($SiO_2$) under the semiconductor layer 3 (poly-silicon) is side-etched to a depth of about 50 nm by, for example, isotropic etching using diluted hydrofluoric acid or the like, to thus obtain a structure shown in FIG. 6 in which a side surface portion of the semiconductor layer 3 (poly-silicon) is overhung. In FIG. 6, the overhung portion is indicated by reference numeral 3'.

Referring to FIG. 7, after $H_2$-cleaning at 900° C. for 5 min, an epitaxial growth layer 6 (thickness: about 10 to 50 nm, dose of boron: $1\times10^{-18}$ to $3\times10^{-19}$ cm$^{-2}$) is formed by selective epitaxial growth performed, for example, at 850° C. under a reduced pressure of several tens Torr, using for example a ($SiH_2Cl_2$+HCl) based gas. The epitaxial growth layer 6 is taken as a base layer 6. At this time, a poly-silicon film 7 grows at the above overhung portion of the side surface of the semiconductor layer 3 (poly-silicon).

Next, as shown in FIG. 8, a $SiO_2$ film as an insulating film is formed by CVD using, for example TEOS (tetraethylorthosilane) as a source gas, followed by etching-back, to form a side wall 8. The side wall 8 acts to isolate an emitter from a base.

Then, a semiconductor layer 9 (poly-silicon layer in this example) having a thickness of 150 nm is formed by CVD performed at about 650° C. using for example a $SiH_4$ gas, followed by ion implantation of for example N+ ions and heat-treatment, to form an emitter diffusion layer 10. After that, respective electrodes are formed using the known various interconnection forming techniques.

The above-described related art method of fabricating a bipolar transistor, however, has the following problem.

In the above-described related art method, as shown in FIGS. 6 and 7, particularly, in FIG. 7, the film 4 of the silicide (tungsten silicide in the above example) of the high melting point metal is exposed at the emitter opening portion (the exposed portion is indicated by reference numeral 4' in FIG. 7). As a result, there is a possibility that upon selective epitaxial growth or upon pre-treatment thereof, that is, cleaning treatment, a chamber atmosphere is contaminated by the metal. The contamination of the chamber atmosphere may cause crystal defects in the epitaxial layer, leading to reduction in yield of semiconductor devices as products. Such a problem occurs in the case where any one of treatments for forming a semiconductor layer in an opening portion is performed in a state in which a high melting point metal based material such as a high melting point metal or a silicide thereof is exposed at the opening portion.

SUMMARY OF THE INVENTION

An object of the present invention is to provide a method of fabricating a semiconductor device, which is capable of preventing occurrence of an inconvenience due to exposure of a high melting point metal based material, for example, contamination of a chamber atmosphere by the metal even upon formation of a semiconductor layer in an opening portion by, for example, selective epitaxial growth or upon pre-treatment thereof, that is, cleaning treatment, to reduce occurrence of crystal defects or the like in the epitaxial layer, thereby forming semiconductor devices at a high yield.

To achieve the above object, according to a first aspect of the present invention, there is provided a method of fabricating a semiconductor device, including the steps of: forming a conductive layer including a high melting point metal based material on a substrate; forming an opening portion in the conductive layer; covering the high melting point metal based material with a film; and forming a semiconductor layer on a portion of the substrate exposed in the opening portion by epitaxial growth after the step of covering the high melting point metal based material with the film.

The above semiconductor layer may be formed by selective epitaxial growth. This is because, since the problem above is a difficulty particularly in formation of a semiconductor layer by selective epitaxial growth, it is desired to apply the present invention for solving such a difficulty.

Further, a portion of the high melting point metal based material exposed in the opening portion may be covered with a poly-silicon film, and an upper portion of the high melting point metal based material may be covered with an insulating film.

According to a second aspect of the present invention, there is provided a method of fabricating a semiconductor device, including the steps of: forming a conductive layer containing a high melting point metal based material on a substrate; forming an insulating film on the conductive layer; forming an opening portion in both the insulating layer and the conductive layer;forming a film for covering the high melting point metal based material on a side wall of the opening portion; and forming a semiconductor layer on a portion of the substrate exposed in the opening portion by epitaxial growth.

The above film for covering the high melting point metal based material may be made from poly-silicon. The poly-silicon may be doped with an impurity.

The above method according to the second aspect of the present invention may further includes the steps of: forming a side wall made of an insulating film on the semiconductor film, to form a second opening portion; and forming a second conductive film in the second opening portion.

The above semiconductor layer may be made from $Si_{(1-x)}Ge_x$ where x is a value in a range of 0<x<1. The above epitaxial growth may be selective epitaxial growth.

According to a third aspect of the present invention, there is provided a method of fabricating a semiconductor device, including the steps of: forming a first insulating film on a substrate; forming a first conductive film on the first insulating film; forming a second conductive film containing a high melting point metal on the first conductive film; forming a second insulating film on the second conductive film; partially removing the second insulating film, the second conductive film, and the first conductive film, to form a first opening portion; covering a side surface of the second conductive film exposed in the first opening portion with a film; etching a portion of the first insulating film exposed in the first opening portion, to expose a surface of the substrate in the first opening portion; and forming a semiconductor layer on the surface of the substrate exposed in the first opening portion by epitaxial growth.

The above film for covering a side surface of the second conductive film may be made from poly-silicon. The poly-silicon may be doped with an impurity.

The above method according to the third aspect of the present invention may further includes the steps of: forming a side wall made of a third insulating film on the semiconductor layer, to form a second opening portion; and forming a third conductive film in the second opening portion.

Each of the above substrate and third conductive film may be of a first conducting type, and the above semiconductor layer may be of a second conducting type.

The above semiconductor layer may be made from $Si_{(1-x)}Ge_x$ where x is a value in a range of 0<x<1. The above etching may be isotropic etching.

In the present invention having the above configuration, even when a semiconductor layer is formed in an opening portion by for example selective epitaxial growth, a side surface of a conductive layer made from a high melting point metal based material (for example, a high melting point metal or a silicide thereof) exposed at an opening portion is covered with a film (called a spacer), and consequently, it is possible to solve the problem of contamination caused by the high melting point metal based material. In this case, the spacer can be made from a semiconductor material such as doped poly-silicon; or it may be made from non-doped poly-silicon and finally doped with an impurity.

As described above, according to the method of fabricating a semiconductor device of the present invention, even upon formation of a semiconductor layer in an opening portion by for example selective epitaxial growth or upon pre-treatment thereof, that is, cleaning treatment, an inconvenience due to exposure of a high melting point metal based material, for example, contamination of a chamber atmosphere due to the metal can be prevented. This is effective to reduce occurrence of crystal defects, and hence to form semiconductor devices at a high yield.

It should be noted that Japanese Patent Laid-open No. Hei 6-112215 discloses a technique in which heavily doped poly-silicon is selectively formed under an overhung portion of a base electrode generated by wet etching of a silicon oxide film. This technique is, however, intended to reduce a base resistance while preventing etching damage, and therefore, it has no relation with the present invention. The document basically does not describe or assume use of a high melting point metal or a silicide thereof, and consequently in the technique disclosed in this document, there never occurs a problem of contamination due to exposure of a high melting point metal or a silicide thereof. As a result, the technique disclosed in this document is quite different in basic thought from the present invention.

DETAILED DESCRIPTION OF THE INVENTION

Hereinafter, the present invention will be described in detail by way of examples with reference to the drawings.

Example 1

A first example of the present invention will be described in detail with reference to FIGS. 1 to 5. In this example, the present invention is applied to a method of fabricating a high-speed bipolar transistor. FIGS. 1 to 5 are sectional views of an emitter portion and a base portion of an NPN transistor having a base extension electrode of a P$^+$-type poly-Si/WSi structure in the order of fabrication steps.

Figure 1:
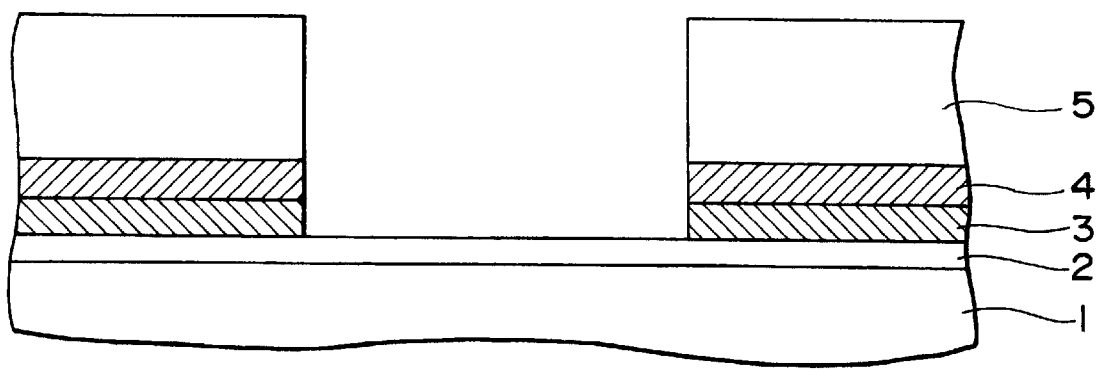
FIGS. 1 to 5 are sectional views of structures of a semiconductor device, illustrating sequential steps of fabricating a semiconductor device according to the present invention.

In this example, as shown in FIG. 1, an oxide insulating film 2 (SiO$_2$ in this example) having a thickness of for example 30 nm was formed over the entire surface of a semiconductor substrate 1 (silicon substrate in this example) by thermal oxidation.

Next, a semiconductor layer 3 (poly-silicon film in this example) having a thickness of 100 nm was formed by CVD performed at about 650° C. using for example a SiH$_4$ based gas, and further, a silicide film 4 (WSi film in this example) having a thickness of 80 nm was formed over the entire surface by CVD performed at about 700° C. using for example a WF$_6$/H$_2$ based gas. Then, ions of, for example, BF$_2$ were implanted at 30 keV in a dose of $5\times10^{-15}$ cm$^{-2}$, to covert the poly-silicon film into a P$^+$-type poly-Si film, thus forming a P-type polycide.

Next, an insulating film 5 (silicon nitride film, particularly, Si$_3$N$_4$ film in this example) having a thickness of 150 to 200 nm was formed over the entire surface by for example CVD. Then, these films were patterned using a photoresist having an opening at an emitter forming portion. To be more specific, the insulating film 5 (Si$_3$N$_4$ film) in the opening portion was removed by RIE using for example an O$_2$/CHF$_3$ based gas, and the silicide/semiconductor layer (WSi/poly-silicon) was removed by RIE using for example a SF$_6$/C$_2$Cl$_2$F$_3$ gas.

Figure 2:
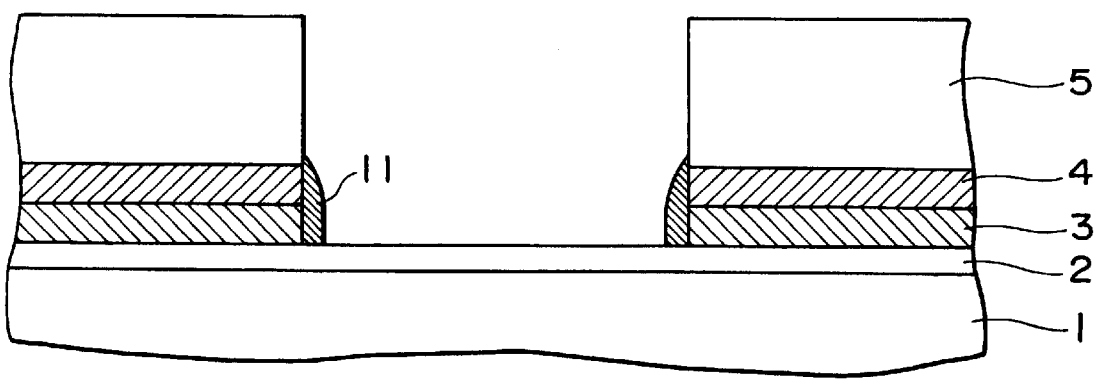

Next, in this example, as shown in FIG. 2, a boron-doped poly-silicon film having a thickness of 20 to 100 nm was formed by CVD performed at about 650° C., followed by RIE using for example a SF$_6$/C$_2$Cl$_2$F$_3$ based gas, to form a side wall-like spacer 11. At this etching, the oxide insulating film 2 was used as a stopper against etching. Here, the formation of the spacer 11 was performed such that an exposed side surface of the silicide film 4 (WSi film) as the conductive layer made from the high melting point metal based material was covered with the side wall-like spacer 11.

In this case, if the spacer 11 is given a conductivity by diffusion of an impurity from the semiconductor layer 3 (P$^+$-type poly-Si) by the subsequent heat-treatment step, the spacer 11 may be made from non-doped poly-silicon. For example, if the spacer 11 is thin, an impurity is sufficiently diffused from the semiconductor layer 3 (P$^+$-type poly-Si).

Figure 3:
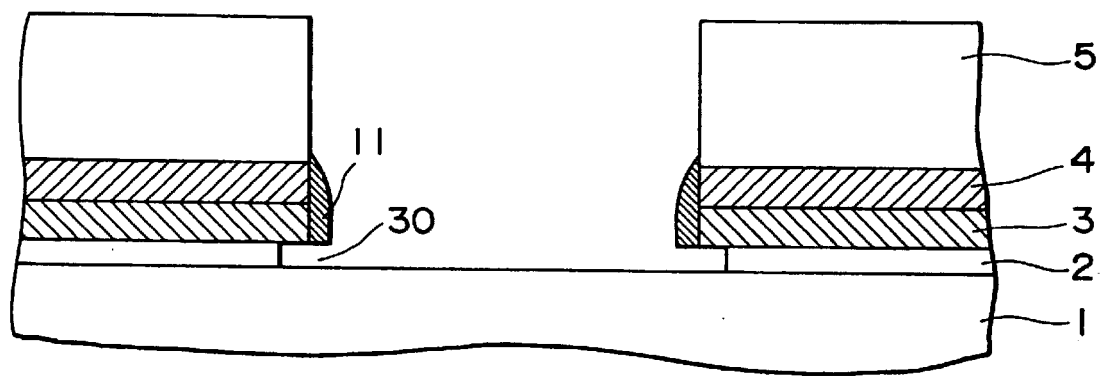

Then, as shown in FIG. 3, the oxide insulating film 2 (SiO$_2$) under the semiconductor layer 3 (poly-silicon) was side-etched to a depth of about 20 to 80 nm by, for example, isotropic etching using diluted hydrofluoric acid or the like. In FIG. 3, the side-etched portion is indicated by reference numeral 30.

Figure 4:
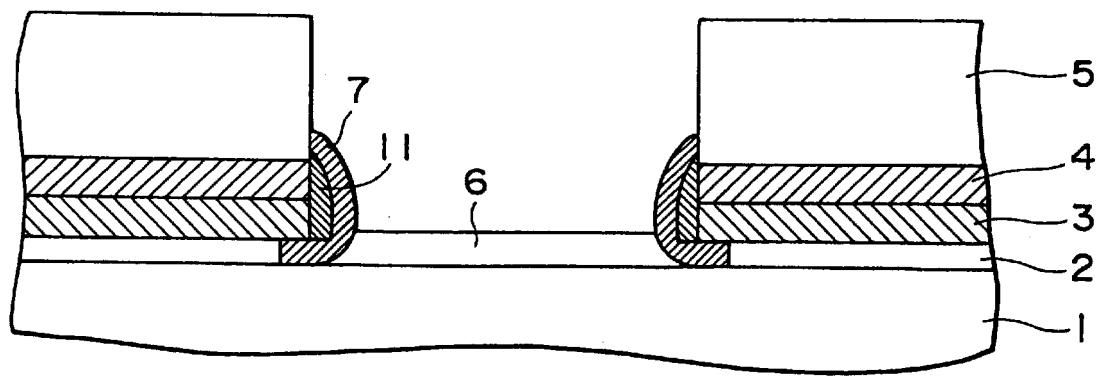

Next, as shown in FIG. 4, after H$_2$-cleaning at 900° C. for 5 min, a semiconductor layer 6 composed of an epitaxial growth layer (thickness: about 10 to 50 nm, dose of boron: $1\times10^{-18}$ to $3\times10^{-19}$ cm$^{-2}$) was formed by selective epitaxial growth performed, for example, at 850° C. under a reduced pressure of several tens Torr, using for example a (SiH$_2$Cl$_2$+ HCl) based gas. The semiconductor layer 6 is taken as a base layer 6. At this time, a poly-silicon film 7 grew at the above overhung portion of the side surface of poly-silicon (semiconductor layer 3) constituting the stacked film.

Figure 5:
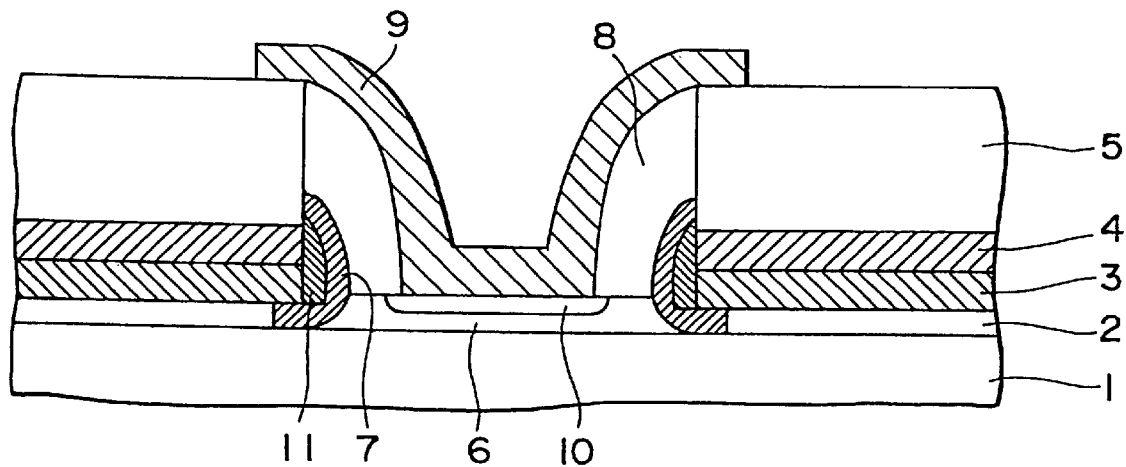
Figure 6:
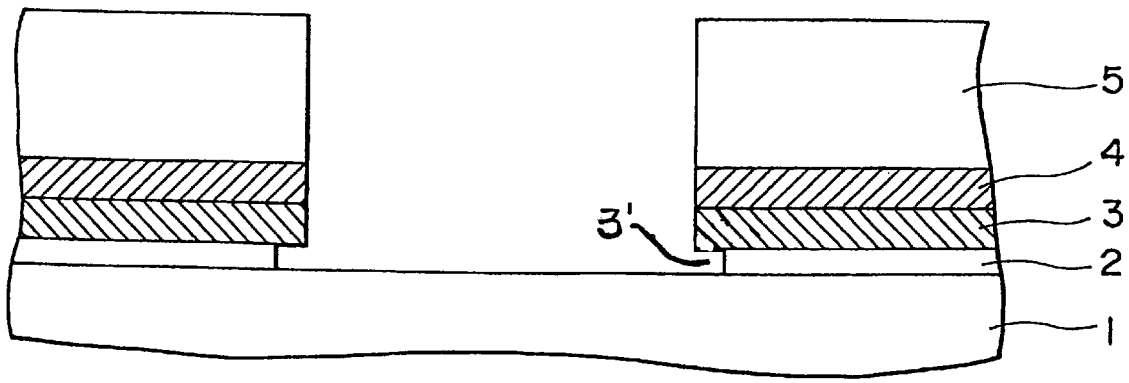
FIGS. 6 to 8 are sectional views of structures of a semiconductor device, illustrating sequential steps of a related art method of fabricating a semiconductor device.
Figure 7:
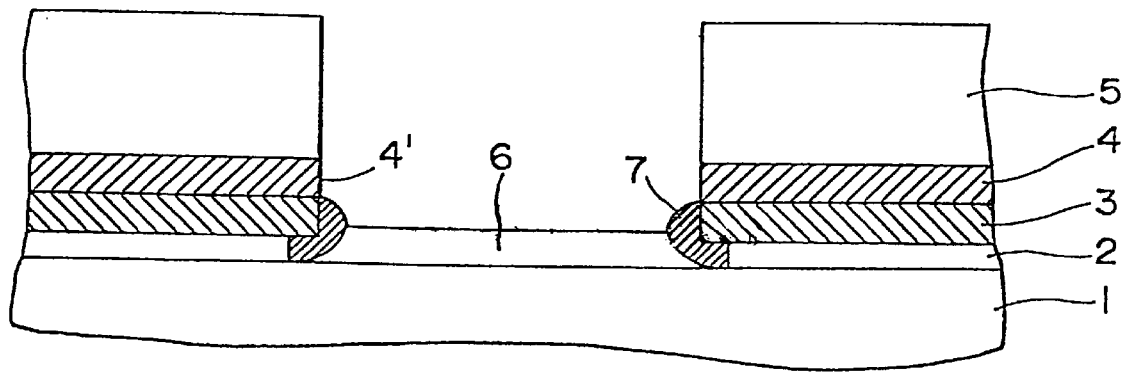
Figure 8:
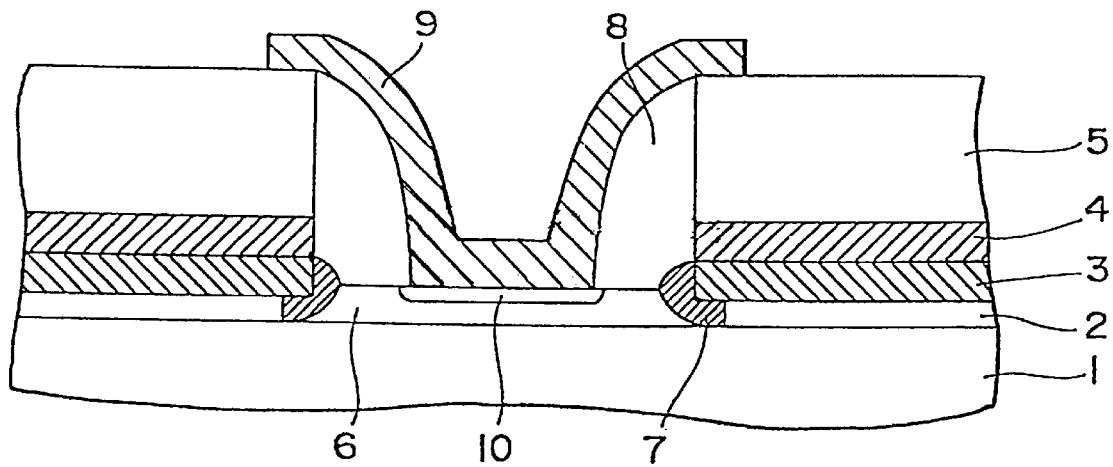

Next, as shown in FIG. 5, a SiO$_2$ film as an insulating film was formed by CVD using for example TEOS as a source gas, followed by etching-back, to form a side wall 8. The side wall 8 acts to isolate an emitter from a base.

Then, a semiconductor layer 9 (poly-silicon layer in this example) having a thickness of 150 nm was formed by CVD performed at about 650° C. using for example a SiH$_4$ gas, followed by ion implantation of for example N$^+$ ions and heat-treatment, to form an emitter diffusion layer 10. After that, respective electrodes were formed using the known various interconnection forming techniques.

According to this example, upon formation of a semiconductor layer in an opening, particularly, upon formation of a semiconductor layer in an opening portion by epitaxial growth, the selective epitaxial growth is performed in a state in which a side surface of a silicide layer in the emitter opening portion is covered with a spacer made from poly-silicon. As a result, it is possible to prevent contamination of a chamber atmosphere due to a high melting point metal based material upon epitaxial growth or pre-treatment thereof, that is, cleaning treatment. This makes it possible to form an epitaxial base layer without crystal defects, and hence to form high-speed bipolar transistors at a high yield.

Example 2

Although the silicon layer was used as the epitaxial base layer in Example 1, a layer made from SiGe having a band gap smaller than that of Si was formed as the base layer by epitaxial growth in this example. Thus, there was obtained a higher-speed hetero-bipolar transistor. The other configuration was the same as that in Example 1.

In each of Examples 1 and 2, the WSi film was used as the high melting metal containing conductive film causing metal contamination; however, the same effect can be obtained in the case of using as the above conductive film made from one kind selected from high melting metals such as W, Ti, Mo, Co, Ni, and Pt or silicides thereof.

While the present invention has been described by way of the examples, such description is for illustrative purposes only, and it is to be understood that changes and variations may be made without departing from the spirit or scope of the following claims.

What is claimed is:

1. A method of fabricating a semiconductor device, comprising the steps of:

forming a conductive layer containing a high melting point metal based material on a substrate;

forming an opening portion in said conductive layer;

covering a side surface of said high melting point metal based material with a spacer layer; and forming a semiconductor base layer on a portion of said substrate exposed in said opening portion by epitaxial growth after said step of covering the side surface of said high melting point metal based material with the spacer layer.

2. A method of fabricating a semiconductor device according to claim 1, wherein said semiconductor layer is formed by selective epitaxial growth.

3. A method of fabricating a semiconductor device according to claim 1, wherein a portion of said high melting point metal based material exposed in said opening portion is covered with a poly-silicon film, and an upper portion of said high melting point metal based material is covered with an insulating film.

4. A method of fabricating a semiconductor device, comprising the steps of:

forming a conductive layer containing a high melting point metal based material on a substrate;

forming an insulating film on said conductive layer;

forming an opening portion in both said insulating layer and said conductive layer;

forming a spacer layer for covering a side surface of said high melting point metal based material on a side wall of said opening portion and;

forming a semiconductor base layer on a portion of said substrate exposed in said opening portion by epitaxial growth after said step of covering the side surface of said high melting point metal based material with the spacer layer.

5. A method of fabricating a semiconductor device according to claim 4, wherein said spacer layer for covering said high melting point metal based material is made from poly-silicon.

6. A method of fabricating a semiconductor device according to claim 5, wherein said poly-silicon is doped with an impurity.

7. A method of fabricating a semiconductor device according to claim 4, further comprising the steps of:

forming a side wall made of an insulating film on said semiconductor base layer to form a second opening portion; and forming a second conductive layer in said second opening portion.

8. A method of fabricating a semiconductor device according to claim 4, wherein said semiconductor layer is made from $Si_{(1-x)}Ge_x$ where x is a value in a range of $0<x<1$.

9. A method of fabricating a semiconductor device according to claim 4, wherein said epitaxial growth is selective epitaxial growth.

10. A method of fabricating a semiconductor device, comprising the steps of:

forming a first insulating film on a substrate;

forming a first conductive film on said first insulating film;

forming a second conductive film containing a high melting point metal on said first conductive film;

forming a second insulating film on said second conductive film;

partially removing said second insulating film, said second conductive film, and said first conductive film to form a first opening portion;

covering a side surface of said second conductive film exposed in said first opening portion with a spacer layer;

etching a portion of said first insulating film in said first opening portion, to expose a surface of said substrate in said first opening portion and form an overhang portion; and forming a semiconductor base layer on the surface of said substrate exposed in said first opening portion and under the overhang portion by epitaxial growth after said step of covering the side surface of said second conductive layer with the spacer layer.

11. A method of fabricating a semiconductor device according to claim 10, wherein said spacer layer for covering the side surface of said second conductive film is made from poly-silicon.

12. A method of fabricating a semiconductor device according to claim 11, wherein said poly-silicon is doped with, an impurity.

13. A method of fabricating a semiconductor device according to claim 10, further comprising the steps of:

forming a side wall made of a third insulating film on said semiconductor layer, to form a second opening portion; and forming a third conductive film in said second opening portion.

14. A method of fabricating a semiconductor device according to claim 13, wherein each of said substrate and said third conductive film is of a first conducting type, and said semiconductor layer is of a second conducting type.

15. A method of fabricating a semiconductor device according to claim 10, wherein said semiconductor layer is made from $Si_{(1-x)}Ge_x$ where x is a value in a range of $0<x<1$.

16. A method of fabricating a semiconductor device according to claim 10, wherein said etching is isotropic etching.

* * * * *